United States Patent
He et al.

(10) Patent No.: US 12,495,683 B2
(45) Date of Patent: Dec. 9, 2025

(54) DISPLAY PANEL INCLUDING FUNCTIONAL CIRCUIT REGION AND BONDING REGION AND DISPLAY DEVICE HAVING THE SAME

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Fan He, Beijing (CN); Rong Wang, Beijing (CN); Xiangdan Dong, Beijing (CN)

(73) Assignees: CHENGDU BOE OPTOELECTRONICS TECHNOLOGY CO., LTD., Sichuan (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 107 days.

(21) Appl. No.: 17/906,101

(22) PCT Filed: Oct. 22, 2021

(86) PCT No.: PCT/CN2021/125618
§ 371 (c)(1),
(2) Date: Sep. 12, 2022

(87) PCT Pub. No.: WO2022/205852
PCT Pub. Date: Oct. 6, 2022

(65) Prior Publication Data
US 2024/0206245 A1 Jun. 20, 2024

(30) Foreign Application Priority Data
Mar. 31, 2021 (CN) .......................... 202110347557.2

(51) Int. Cl.
*H10K 59/12* (2023.01)
*H10K 59/124* (2023.01)
(Continued)

(52) U.S. Cl.
CPC .......... *H10K 59/124* (2023.02); *H10K 59/131* (2023.02); *H10K 59/90* (2023.02); *H10K 59/40* (2023.02)

(58) Field of Classification Search
CPC .... H10K 59/124; H10K 59/131; H10K 59/90; H10K 59/40
(Continued)

(56) References Cited

U.S. PATENT DOCUMENTS

2013/0119388 A1 5/2013 Lee et al.
2020/0081568 A1 3/2020 Xu et al.
(Continued)

FOREIGN PATENT DOCUMENTS

CN 203910800 U 10/2014
CN 106201145 A 12/2016
(Continued)

OTHER PUBLICATIONS

Cite the machine translation Huangfu L (CN-109935580-A).*
(Continued)

*Primary Examiner* — Phuc T Dang
(74) *Attorney, Agent, or Firm* — Calfee, Halter & Griswold LLP

(57) ABSTRACT

The present disclosure provides a display panel and a display device. The display panel includes: a functional circuit region and a bonding region on a side of the functional circuit region; wherein the bonding region includes a substrate, a first conductive pattern on a first surface of the substrate, and a first insulating layer; wherein the first conductive pattern includes a first portion and a second portion; the distance between the top surface of the first portion and the first surface is greater than the distance between the top surface of the second portion and the first surface; the first insulating layer exposes the first portion and
(Continued)

a boundary of the first insulating layer penetrates the second portion.

19 Claims, 8 Drawing Sheets

(51) Int. Cl.
    *H10K 59/131*     (2023.01)
    *H10K 59/90*     (2023.01)
    *H10K 59/40*     (2023.01)

(58) Field of Classification Search
    USPC .......................................................... 257/91
    See application file for complete search history.

(56) References Cited

U.S. PATENT DOCUMENTS

2021/0175465 A1   6/2021   Zhou et al.
2022/0059728 A1   2/2022   Shi et al.

FOREIGN PATENT DOCUMENTS

| | | | | |
|---|---|---|---|---|
| CN | 109935580 A | * | 6/2019 | ........... H01L 27/124 |
| CN | 109949703 A | | 6/2019 | |
| CN | 111952323 A | | 11/2020 | |
| CN | 113066849 A | | 7/2021 | |

OTHER PUBLICATIONS

International Search Report received for PCT Patent Application No. PCT/CN2021/125618, mailed on Jan. 13, 2022, 5 pages (2 pages of English Translation and 3 pages of Original Document).

Notice of Allowance received for Chinese Patent Application No. 202110347557.2, mailed on Nov. 2, 2022, 3 pages (2 pages of English Translation and 1 pages of Original Document).

Office Action received for Chinese Patent Application No. 202110347557.2, mailed on Apr. 8, 2022, 14 pages (7 pages of English Translation and 7 pages of Original Document).

* cited by examiner

```
┌─────────────────────────────────────────────────────────┐ ─S701
│ forming a functional circuit region 10 on a substrate  │
│ 201 and a bonding region 20 on a side of the           │
│ functional circuit region 10; wherein the bonding      │
│ region 20 comprises a first conductive pattern 203 on  │
│ a first surface 202 of the substrate 201; the first    │
│ conductive pattern 203 includes a first portion 205    │
│ and a second portion 206; the distance a between the   │
│ top surface of the first portion 205 and the first     │
│ surface 202 is greater than the distance b between     │
│ the top surface of the second portion 206 and the      │
│ first surface 202                                       │
└─────────────────────────────────────────────────────────┘
                              │
┌─────────────────────────────────────────────────────────┐ ─S702
│  forming a first insulating layer 204 covering the      │
│                    bonding region 20                    │
└─────────────────────────────────────────────────────────┘
                              │
┌─────────────────────────────────────────────────────────┐ ─S703
│ patterning the first insulating layer 204 such that the │
│ first insulating layer 204 exposes the first portion    │
│ 205 and a boundary 209 of the first insulating layer    │
│ 204 penetrates the second portion 206                   │
└─────────────────────────────────────────────────────────┘
```

FIG. 7

DISPLAY PANEL INCLUDING FUNCTIONAL CIRCUIT REGION AND BONDING REGION AND DISPLAY DEVICE HAVING THE SAME

RELATED APPLICATIONS

The present application is a 35 U.S.C. 371 national stage application of PCT International Application No. PCT/CN2021/125618, filed on Oct. 22, 2021, which claims the benefit of Chinese Patent Application under the application No. 202110347557.2 filed on Mar. 31, 2021, the entire disclosure of which is incorporated herein by reference.

FIELD

The present disclosure relates to the field of display technologies, especially to a display panel and a display device.

BACKGROUND

With the rapid development of AMOLEDs (active-matrix organic light-emitting diode), the development of mobile phones has entered a full-screen, narrow-bezel era. In order to bring users a better experience, full screen, narrow bezel, high resolution, curly wearing, folding, and the like will definitely become important development directions for AMOLEDs in the future. In order to achieve lighter and thinner display panels and products with higher integration, an FMLOC (flexible multi-layer on cell) technology came into being.

SUMMARY

The present disclosure provides a display panel and a display device. By decreasing the step difference of the first insulating layer within the bonding region, the risk of peeling of the first insulating layer is reduced.

According to an aspect of the present disclosure, there is provided a display panel. The display panel comprises: a functional circuit region and a bonding region on a side of the functional circuit region; wherein the bonding region comprises a substrate, a first conductive pattern on a first surface of the substrate, and a first insulating layer; wherein the first conductive pattern comprises a first portion and a second portion; a distance between a top surface of the first portion and the first surface is larger than a distance between a top surface of the second portion and the first surface; the first insulating layer exposes the first portion and a boundary of the first insulating layer penetrates the second portion.

Optionally, in some embodiments, the first insulating layer at least partially exposes the second portion.

Optionally, in some embodiments, the second portion is located between the first portion and the functional circuit region.

Optionally, in some embodiments, the display panel further comprises: a second conductive pattern between the substrate and the first conductive pattern; an orthographic projection of the first portion on the substrate overlapping an orthographic projection of the second conductive pattern on the substrate.

Optionally, in some embodiments, a bottom portion of the first portion is electrically connected to a top portion of the second conductive pattern.

Optionally, in some embodiments, the second conductive pattern comprises a plurality of conductive layers stacked on each other.

Optionally, in some embodiments, the first conductive pattern is a pad.

Optionally, in some embodiments, the display panel further comprises: a wiring extending from the functional circuit region to the bonding region; one end of the wiring being electrically connected to the second portion.

Optionally, in some embodiments, the functional circuit region comprises a touch electrode pattern; the touch electrode pattern and the first conductive pattern are located in a same layer; the other end of the wiring is electrically connected to the touch electrode pattern.

Optionally, in some embodiments, the touch electrode pattern comprises a first electrode layer and a second electrode layer, the second electrode layer is located on a side of the first electrode layer away from the substrate, and the first conductive pattern is disposed in a same layer as at least one of the first electrode layer and the second electrode layer.

Optionally, in some embodiments, the first insulating layer is located on a side of the second electrode layer away from the substrate, and the first insulating layer overlaps the touch electrode pattern and the wiring.

Optionally, in some embodiments, the display panel further comprises a second insulating layer between the first conductive pattern and the second conductive pattern.

Optionally, in some embodiments, the second insulating layer comprises a through hole, and the first conductive pattern is electrically connected to the second conductive pattern via the through hole.

According to another aspect of the present disclosure, there is provided a display device. The display device comprises the display panel according to any one of the foregoing embodiments and a flexible circuit board; wherein the flexible circuit board comprises a pin, and the pin is electrically connected to the first conductive pattern.

BRIEF DESCRIPTION OF THE DRAWINGS

In order to more clearly illustrate embodiments of the present disclosure or technical solutions in the prior art, the drawings to be used for description of the embodiments or the prior art will be briefly introduced below. Obviously, the drawings described below are only some embodiments of the present disclosure. A person having an ordinary skill in the art may also obtain other drawings based on these drawings without spending inventive efforts.

FIG. 7 illustrates a flow chart of a manufacturing method of a display panel according to an embodiment of the present disclosure.

DETAILED DESCRIPTION

The technical solutions in embodiments of the present disclosure will be described clearly and comprehensively below in conjunction with the drawings in the embodiments of the present disclosure. Obviously, the described embodiments are only part of the embodiments of the present disclosure, rather than all of them. All other embodiments obtained by a person having an ordinary skill in the art based on the embodiments of the present disclosure without spending inventive efforts fall within the protection scope of the present disclosure.

The inventors noticed that the FMLOC technology fabricates metal mesh wirings between openings of the PDL (pixel defining layer) so as to form Tx and Rx channels of the FMLOC technology to realize the touch function. The same metal layer is used to form Tx and Rx signal channels, then another metal layer is used at an overlap of the Tx and Rx channels to form bridging so as to realize communication between the Tx and Rx signal channels, and finally an OC planarization layer (i.e., optically clear adhesive layer) is covered on the touch array unit. The top OC planarization layer of an FMLOC product is an organic material. The OC planarization layer needs to be removed from the position where the FMLOC product is bonded to an FPC (flexible printed circuit board), because the metal pad at that position needs to be exposed for bonding the FPC. In an actual process, if a large step difference occurs at the boundary of the OC planarization layer, it will cause peeling at the boundary of the OC planarization layer, resulting in disconnection of the touch panel and a touch failure.

Figure 1:
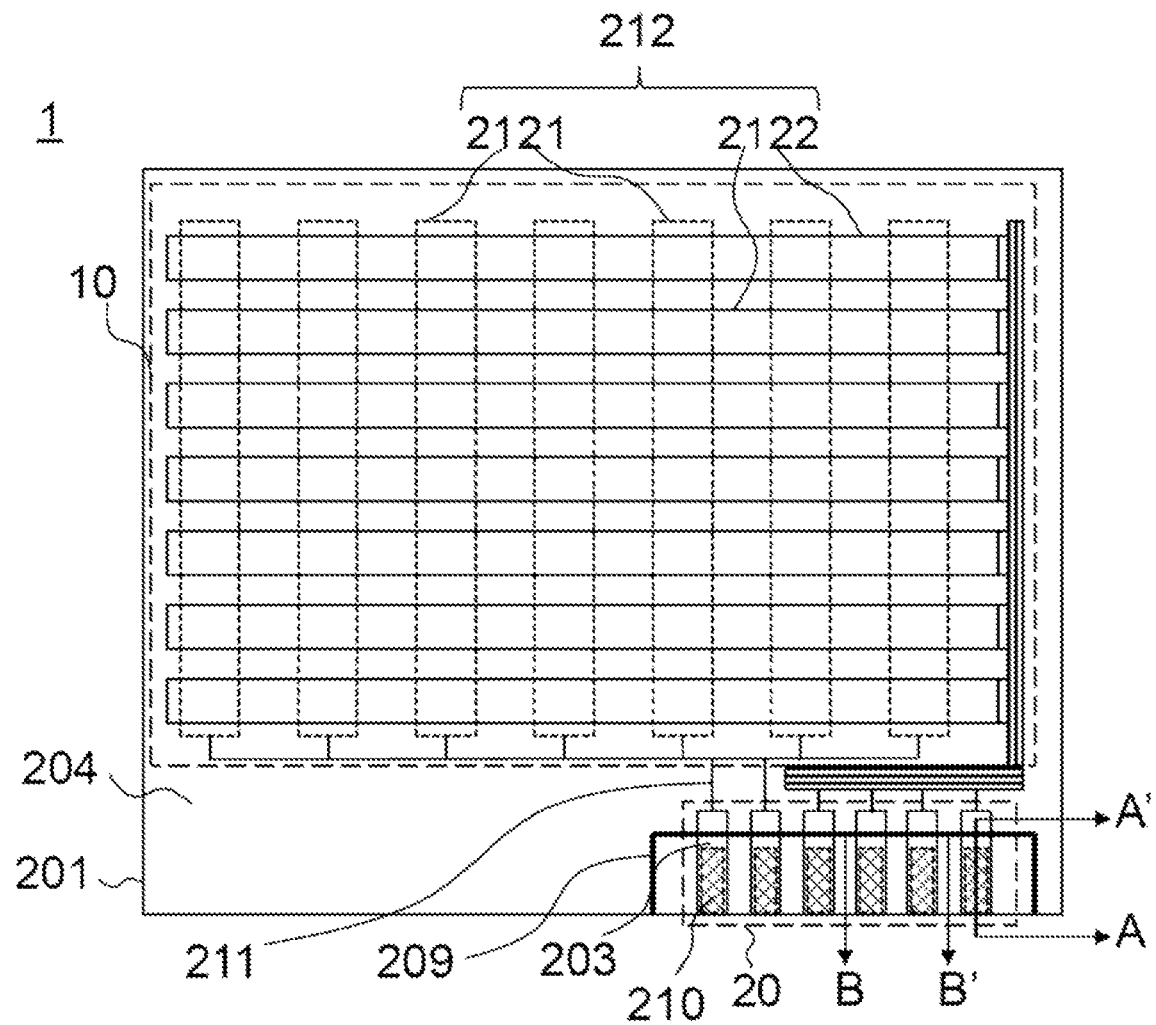
FIG. 1 illustrates a top view of a display panel according to an embodiment of the present disclosure.
Figure 2:
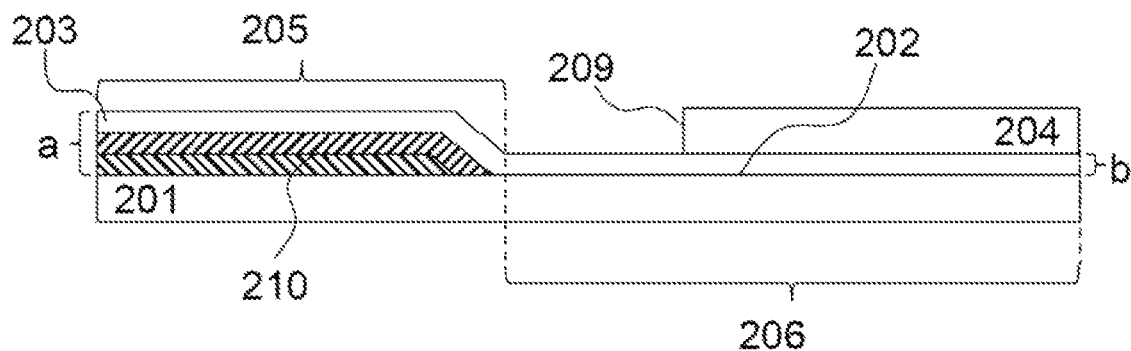
FIG. 2 illustrates a cross-sectional view of the display panel shown in FIG. 1 taken along line AA'.

According to an aspect of the present disclosure, there is provided a display panel. FIG. 1 illustrates a top view of a display panel according to an embodiment of the present disclosure. FIG. 2 illustrates a cross-sectional view of the display panel shown in FIG. 1 taken along line AA'. The shape, size and thickness of each film layer in the drawings do not reflect the actual scale of each film layer, and are only intended to illustrate the present disclosure. As shown in FIGS. 1 and 2, the display panel 1 comprises: a functional circuit region 10 and a bonding region 20 on a side of the functional circuit region 10; wherein the bonding region 20 comprises a substrate 201, a first conductive pattern 203 on a first surface 202 of the substrate 201, and a first insulating layer 204; wherein the first conductive pattern 203 comprises a first portion 205 and a second portion 206; a distance u between a top surface 207 of the first portion 205 and the first surface 202 is greater than a distance b between a top surface 208 of the second portion 206 and the first surface 202; the first insulating layer 204 exposes the first portion 205 and a boundary 209 of the first insulating layer 204 penetrates the second portion 206.

Figure 3:
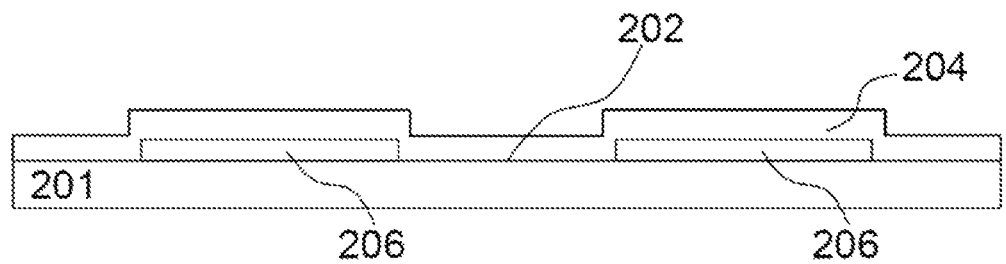
FIG. 3 illustrates a cross-sectional view of the display panel shown in FIG. 1 taken along line BB'.

FIG. 3 illustrates a cross-sectional view of the display panel shown in FIG. 1 taken along line BB', i.e., a cross-sectional view taken along a portion of the boundary 209 of the first insulating layer 204. It can be seen from FIG. 3 that the step difference of the first insulating layer 204 within the bonding region 20 is the thickness of the second portion 206.

In the context of the present disclosure, "a distance between a top surface of the first portion and the first surface" refers to the distance between the top surface of the first portion and the first surface in a direction perpendicular to the first surface (or in a direction parallel to the normal of the first surface). Similarly, "a distance between a top surface of the second portion and the first surface" refers to the distance between the top surface of the second portion and the first surface in a direction perpendicular to the first surface (or in a direction parallel to the normal to the first surface).

In the embodiments of the present disclosure, the first conductive pattern 203 in the bonding region 20 comprises a first portion 205 and a second portion 206; a distance a between a top surface 207 of the first portion 205 and the first surface 202 is greater than a distance b between a top surface 208 of the second portion 206 and the first surface 202; the first insulating layer 204 exposes the first portion 205 and a boundary 209 of the first insulating layer 204 penetrates the second portion 206. With the above arrangement, the step difference of the first insulating layer 204 within the bonding region 20 is decreased, thus reducing the risk of peeling of the first insulating layer 204. In addition, since the first insulating layer 204 covers a local region of the second portion 206, an end of the first conductive pattern 203 is also effectively protected (i.e., an end of the second portion 206 facing away from the first portion 205), reducing the risk of corrosion of the first conductive pattern 203.

The first insulating layer 204 may be an organic insulating layer, such as an optically clear adhesive layer.

Optionally, in some embodiments, as shown in FIGS. 1 and 2, the first insulating layer 204 at least partially exposes the second portion 206.

The first insulating layer 204 covers at least a part of the second portion 206 and can effectively protect an end of the first conductive pattern 203 (i.e., an end of the second portion 206 facing away from the first portion 205), reducing the risk of corrosion of the first conductive pattern 203.

Optionally, in some embodiments, as shown in FIGS. 1 and 2, the second portion 206 is located between the first portion 205 and the functional circuit region 10.

The second portion 206 may be arranged between the first portion 205 and the functional circuit region 10. Thus, the first portion 205 can be used as a pad of the display panel to connect the display panel to an external circuit.

Optionally, in some embodiments, as shown in FIGS. 1 and 2, the display panel 1 further comprises: a second conductive pattern 210 between the substrate 201 and the first conductive pattern 203. An orthographic projection of the first portion 205 on the substrate 201 overlaps an orthographic projection of the second conductive pattern 210 on the substrate 201.

In some embodiments, the display panel 1 may further comprise a second conductive pattern 210 between the substrate 201 and the first conductive pattern 203. The second conductive pattern 210 may be a conductive film layer used to fabricate the functional circuit region 10 of the display panel. The functional circuit region 10 may, for example, include a circuit structure such as a touch circuit, a display circuit, and the like. The second conductive pattern 210 may be a metal pattern and/or a conductive metal oxide pattern. Therefore, the film layer of the second conductive pattern 210 can not only be used to fabricate the circuit structure of the functional circuit region 10, but also can form the second conductive pattern 210, thereby further reducing the impedance between the circuit structure of the functional circuit region 10 and the external circuit.

Optionally, in some embodiments, as shown in FIG. 2, the bottom portion of the first portion 205 is electrically connected to the top portion of the second conductive pattern 210.

Figure 4:
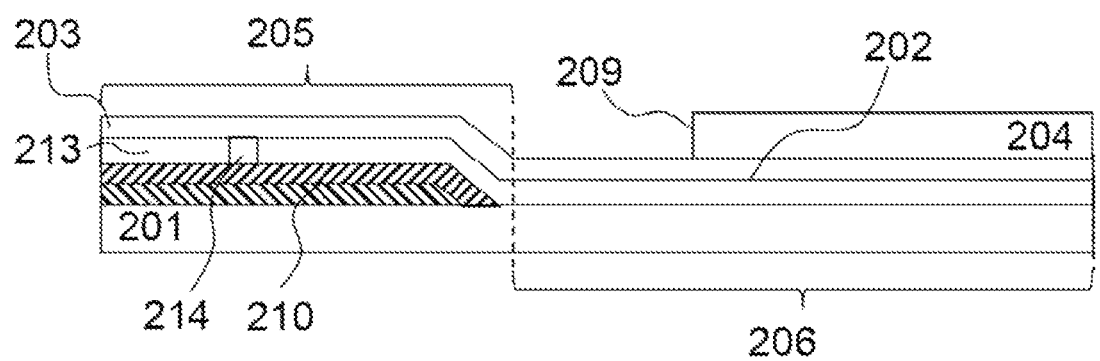
FIG. 4 illustrates a cross-sectional view of a display panel according to another embodiment of the present disclosure.

The first portion 205 may cover the top surface of the second conductive pattern 210 and be in direct contact with the top surface of the second conductive pattern 210. Alternatively, the first portion 205 may also be electrically connected to the second conductive pattern 210 via a through hole (as shown in FIG. 4), but the present disclosure is not limited thereto. Thus, when the first portion 205 is used as a pad of the display panel 1, the impedance between the pad and the external circuit is further reduced.

Optionally, in some embodiments, as shown in FIG. 2, the second conductive pattern 210 includes a plurality of conductive layers stacked on each other.

At the time of fabricating the functional circuit region 10 of the display panel, a plurality of conductive layers is generally used to form various structures of the circuit. Therefore, a portion of each conductive layer corresponding to the second conductive pattern 210 may be retained during the fabrication process, thereby achieving a good electrical contact of the bonding region.

Optionally, in some embodiments, the first conductive pattern 203 is a pad.

The first conductive pattern 203 may be used as a pad to connect the display panel 1 to an external circuit.

Optionally, in some embodiments, as shown in FIG. 1, the display panel 1 further comprises: a wiring 211 extending from the functional circuit region 10 to the bonding region 20. One end of the wiring 211 is electrically connected to the second portion 206.

Using the wiring 211, signals can be input to the display panel 1 via the first conductive pattern 203 and the wiring 211, and the display panel 1 can also output signals to an external circuit via the first conductive pattern 203 and the wiring 211. In addition, the wiring 211 may also be arranged in the same layer as the second conductive pattern 210, that is, the wiring 211 and the second conductive pattern 210 may be fabricated using the same material in the same patterning process (e.g., photolithography process). Alternatively, the wiring 211 and the first conductive pattern 203 may also be fabricated using the same material in the same patterning process (e.g., photolithography process), and the present disclosure is not limited thereto.

Optionally, in some embodiments, as shown in FIG. 1, the functional circuit region 10 comprises a touch electrode pattern 212. The touch electrode pattern 212 and the first conductive pattern 203 are located in the same layer, and the other end of the wiring 211 is electrically connected to the touch electrode pattern 212.

With the above arrangement, a touch display panel with an FMLOC structure can be obtained.

Optionally, in some embodiments, as shown in FIG. 1, the touch electrode pattern 212 includes a first electrode layer 2121 and a second electrode layer 2122. The second electrode layer 2122 is located on a side of the first electrode layer 2121 away from the substrate 201, and the first conductive pattern 203 is disposed in the same layer as at least one of the first electrode layer 2121 and the second electrode layer 2122.

In some embodiments, as shown in FIG. 1, the first conductive pattern 203 and the second electrode layer 2122 are disposed in the same layer. In the embodiment shown in FIG. 1, the second electrode layer 2122 is located on a side of the first electrode layer 2121 away from the substrate 201, so the first electrode layer 2121 is indicated by a broken line pattern.

Optionally, in some embodiments, as shown in FIG. 1, the first insulating layer 204 is located on a side of the second electrode layer 2122 away from the substrate, and the first insulating layer 204 overlaps the touch electrode pattern 212 and the wiring 211.

Figure 5:
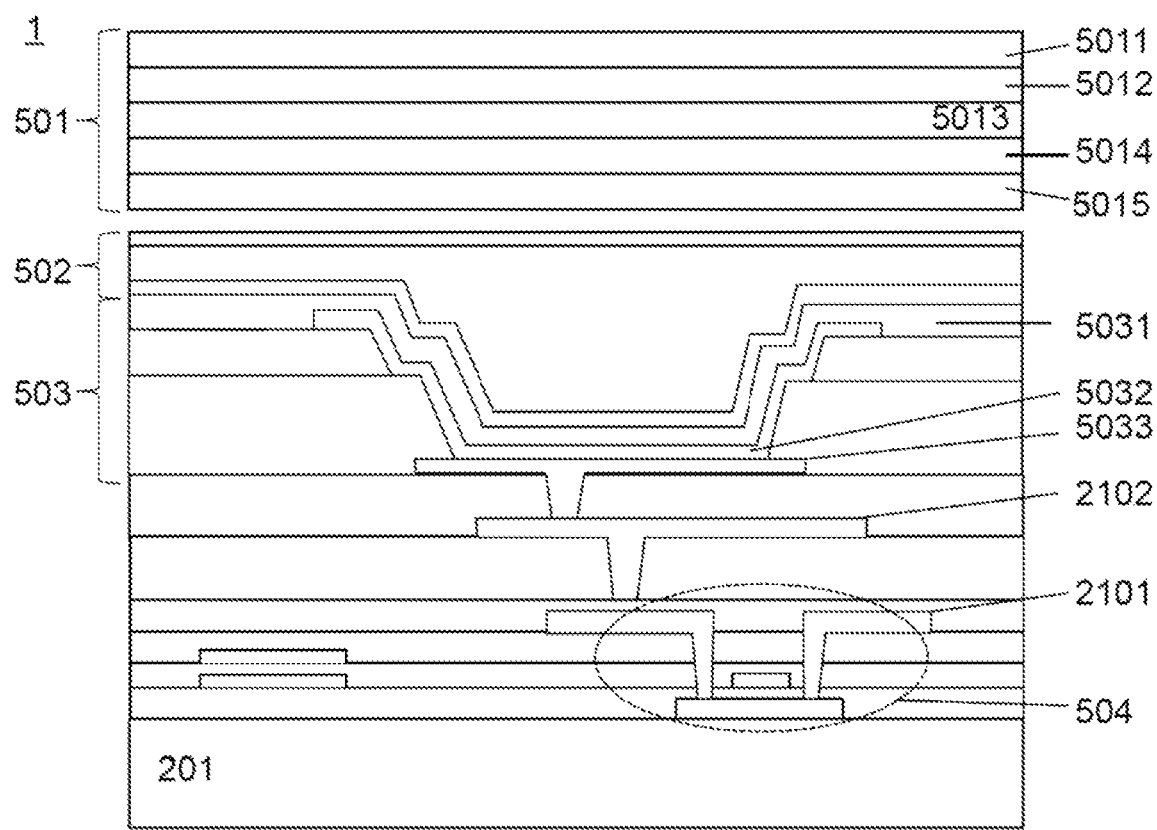
FIG. 5 illustrates a cross-sectional view of a display panel according to a further embodiment of the present disclosure.

In some embodiments, as shown in FIG. 5, the display panel 1 comprises an FMLOC touch module 501, an encapsulation layer 502, a light emitting element 503, a driving TFT 504, and a substrate 201. The FMLOC touch module 501 comprises an optically clear adhesive (OCA) layer 5011, a metal mesh 5012, a SiNx layer 5013, a bridging layer 5014, and a buffer layer 5015. The light emitting element 503 may be an organic light emitting diode. The light emitting element 503 may comprise a cathode 5031, a light emitting layer 5032, and an anode 5033. The driving TFT 504 may comprise a source pattern 2101 and a drain pattern 2102. The second conductive pattern 210 is in the same layer as the source/drain pattern. That is, the conductive layer where the source pattern 2101 is located and the conductive layer where the drain pattern 2102 is located may be patterned respectively to obtain the source pattern 2101, the drain pattern 2102, and the second conductive pattern 210. In this embodiment, the second conductive pattern 210 includes a part of the conductive layer where the source pattern 2101 is located and a part of the conductive layer where the drain pattern 2102 is located.

Optionally, in some embodiments, as shown in FIG. 4, the display panel further comprises a second insulating layer 213 between the first conductive pattern 203 and the second conductive pattern 210.

The second insulating layer 213 may be arranged between the first conductive pattern 203 and the second conductive pattern 210, so that the second conductive pattern 210 is covered with the second insulating layer 213 to prevent the sides of the second conductive pattern from being corroded.

Optionally, in some embodiments, as shown in FIG. 4, the second insulating layer 213 comprises a through hole 214, and the first conductive pattern 203 is electrically connected to the second conductive pattern 210 via the through hole 214.

In the embodiments of the present disclosure, using the through hole 214, the first conductive pattern 203 may be electrically connected to the second conductive pattern 210 via the through hole 214. As a result, not only the sides of the second conductive pattern 210 can be prevented from being corroded, but also a good electrical contact of the bonding region can be ensured.

Figure 6:
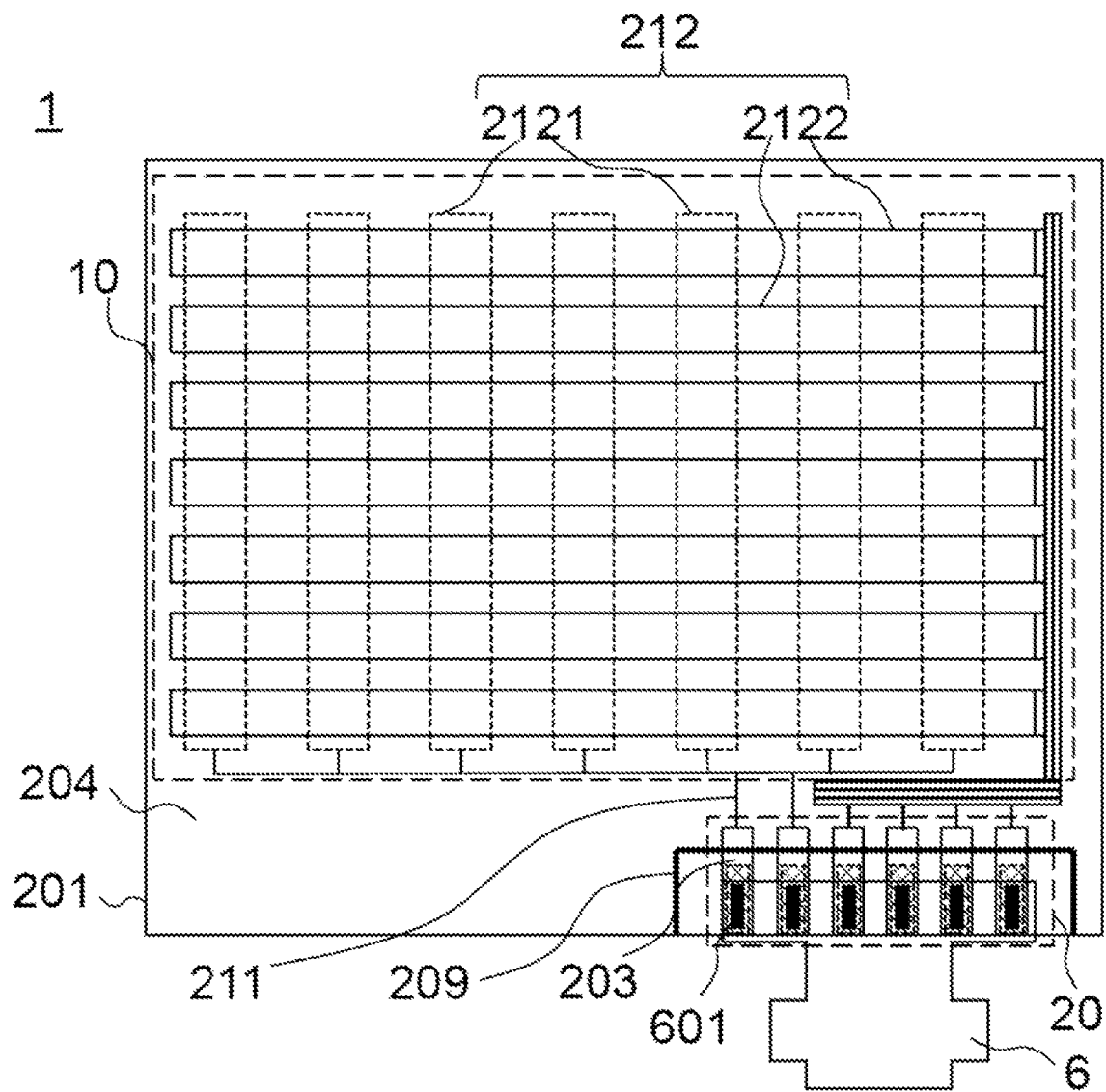
FIG. 6 illustrates a schematic view of a display device according to an embodiment of the present disclosure.

According to another aspect of the present disclosure, there is provided a display device. As shown in FIG. 6, the display device comprises: the display panel 1 as described in any of the foregoing embodiments and a flexible circuit board 6; wherein the flexible circuit board 6 comprises a pin 601, and the pin 601 is electrically connected to the first conductive pattern 203. Using the pin 601 and the first conductive pattern 203, signal transmission can be realized between the display panel 1 and the flexible circuit board 6. The display device can be any product or component with a display function, such as a mobile phone, a tablet computer, a TV, a monitor, a notebook computer, a digital photo frame, a navigator, and the like. For the implementation of the display device, reference may be made to the above embodiments of the display panel, and repeated descriptions will not be repeated.

In the embodiments of the present disclosure, the first conductive pattern 203 in the bonding region 20 comprises a first portion 205 and a second portion 206; the distance a between the top surface 207 of the first portion 205 and the first surface 202 is greater than the distance b between the top surface 208 of the second portion 206 and the first surface 202; the first insulating layer 204 exposes the first portion 205 and a boundary 209 of the first insulating layer 204 penetrates the second portion 206. With the above arrangement, the step difference of the first insulating layer 204 within the bonding region 20 is decreased, thus reducing the risk of peeling of the first insulating layer 204. In addition, since the first insulating layer 204 covers a local region of the second portion 206, an end of the first conductive pattern 203 is also effectively protected (i.e., an end of the second portion 206 facing away from the first portion 205), reducing the risk of corrosion of the first conductive pattern 203.

Figure 8:
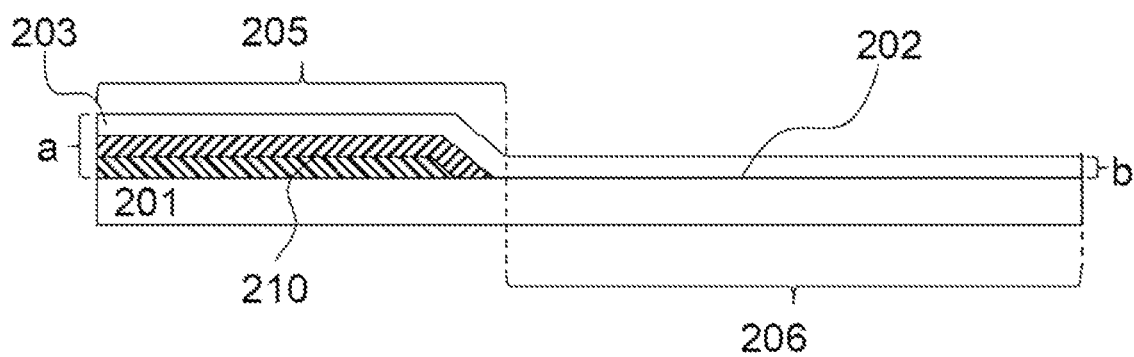
FIGS. 8-10 illustrate schematic structural views corresponding to various steps of the manufacturing method of a display panel shown in FIG. 7, respectively.
Figure 9:
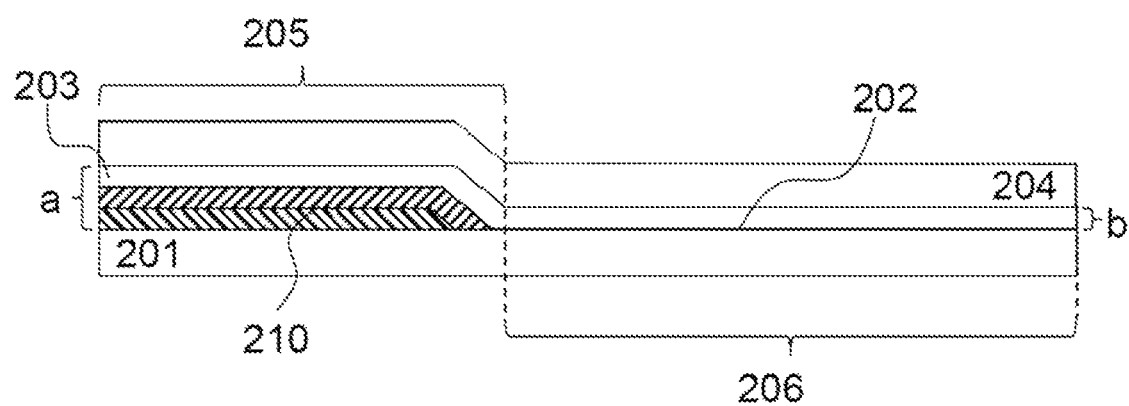
Figure 10:
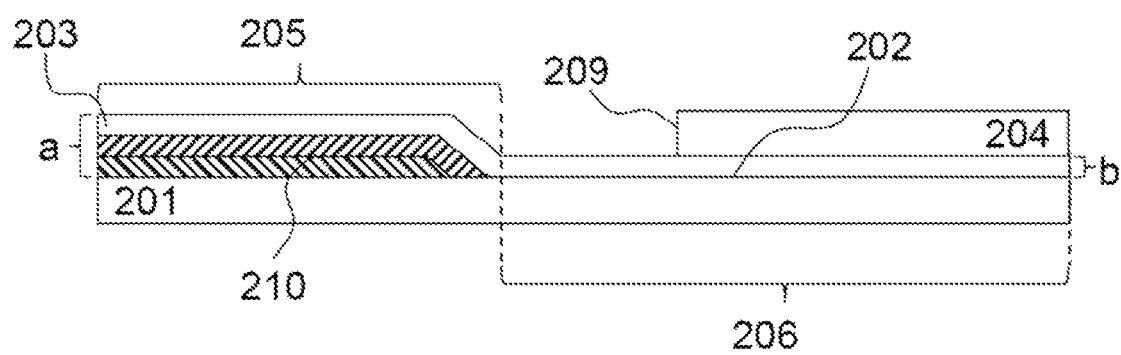

According to a further aspect of the present disclosure, there is provided a manufacturing method of a display panel. FIG. 7 illustrates a flow chart of a manufacturing method of a display panel according to an embodiment of the present disclosure. FIGS. 8-10 illustrate schematic structural views corresponding to various steps of the manufacturing method of a display panel shown in FIG. 7, respectively. As shown in FIG. 7, the method comprises: S701, forming a functional circuit region 10 on a substrate 201 and a bonding region 20 on a side of the functional circuit region 10; wherein the bonding region 20 comprises a first conductive pattern 203 on a first surface 202 of the substrate 201; the first conductive pattern 203 includes a first portion 205 and a second portion 206; the distance a between the top surface of the first portion 205 and the first surface 202 is greater than the distance b between the top surface of the second portion 206 and the first surface 202 (as shown in FIG. 8); S702, forming a first insulating layer 204 covering the bonding region 20 (as shown in FIG. 9); and S703, patterning the first insulating layer 204 such that the first insulating layer 204 exposes the first portion 205 and a boundary 209 of the first insulating layer 204 penetrates the second portion 206 (as shown in FIG. 10).

In the embodiments of the present disclosure, the process for patterning the first insulating layer 204 may be a photolithography process. For example, after step S702 is completed, a layer of photoresist may be coated on the first insulating layer 204 shown in FIG. 9, and the photoresist is exposed by using a mask. After developing and etching the photoresist, the first insulating layer 204 shown in FIG. 10 is obtained.

According to the manufacturing method of a display panel provided by the embodiments of the present disclosure, the step difference of the first insulating layer 204 within the bonding region 20 is decreased, thus reducing the risk of peeling of the first insulating layer 204. In addition, since the first insulating layer 204 covers a local region of the second portion 206, an end of the first conductive pattern 203 is also effectively protected (i.e., an end of the second portion 206 facing away from the first portion 205), reducing the risk of corrosion of the first conductive pattern 203.

In the description of the present disclosure, the orientations or positional relationships indicated by the terms such as "upper" and "lower" are based on orientations or positional relationships shown in the drawings, which are only for facilitating description of the present disclosure, rather than requiring that the present disclosure must be constructed and operated in a particular orientation, thus they cannot be construed as limitations to the present disclosure.

In the description of this specification, the description with reference to the terms "an embodiment", "another embodiment", etc. means that a specific feature, structure, material or characteristic described in conjunction with said embodiment is included in at least one embodiment of the present disclosure. In this specification, the schematic representations of the above-mentioned terms do not necessarily refer to the same embodiment or example. Moreover, the described specific feature, structure, material or characteristic may be combined in any one or more embodiments or examples in a suitable manner. In addition, those skilled in the art can combine different embodiments or examples and the features of the different embodiments or examples described in this specification in the case of causing no conflict. In addition, it is to be noted that in this specification, the terms "first" and "second" are only used for descriptive purposes, and cannot be understood as indicating or implying relative importance or implicitly indicating the number of indicated technical features.

What have been stated above are only specific embodiments of the present disclosure, but the protection scope of the present disclosure is not limited thereto. Any variations or substitutions that can be easily conceived by those skilled in the art familiar with this technical field within the technical scope revealed by the present disclosure should be encompassed within the protection scope of the present disclosure. Thus, the protection scope of the present disclosure should be based on the protection scope of the claims.

What is claimed is:

1. A display panel comprising:
   a functional circuit region and a bonding region on a side of the functional circuit region;
   wherein the bonding region comprises a substrate, a first conductive pattern on a first surface of the substrate, and a first insulating layer;
   wherein the first conductive pattern comprises a first portion and a second portion; a distance between a top surface of the first portion and the first surface is larger than a distance between a top surface of the second portion and the first surface; the first insulating layer exposes the first portion and a boundary of the first insulating layer penetrates the second portion,
   wherein the second portion is located between the first portion and the functional circuit region, and
   wherein the functional circuit region comprises a touch electrode pattern, the touch electrode pattern and the first conductive pattern are located in a same layer.

2. The display panel according to claim 1, wherein the first insulating layer at least partially exposes the second portion.

3. The display panel according to claim 1, wherein the first conductive pattern is a pad.

4. A display device, comprising the display panel according to claim 1 and a flexible circuit board;
   wherein the flexible circuit board comprises a pin, and the pin is electrically connected to the first conductive pattern.

5. The display device according to claim 4, wherein the first insulating layer at least partially exposes the second portion; the second portion is located between the first portion and the functional circuit region.

6. The display device according to claim 4, further comprising: a second conductive pattern between the substrate and the first conductive pattern; an orthographic projection of the first portion on the substrate overlapping an orthographic projection of the second conductive pattern on the substrate.

7. The display device according to claim 4, wherein the first conductive pattern is a pad.

8. The display device according to claim 4, further comprising: a wiring extending from the functional circuit region to the bonding region; one end of the wiring being electrically connected to the second portion.

9. The display device according to claim 8, wherein the functional circuit region comprises a touch electrode pattern; the touch electrode pattern and the first conductive pattern are located in a same layer; the other end of the wiring is electrically connected to the touch electrode pattern.

10. The display device according to claim 9, wherein the touch electrode pattern comprises a first electrode layer and a second electrode layer, the second electrode layer is located on a side of the first electrode layer away from the substrate, and the first conductive pattern is disposed in a same layer as at least one of the first electrode layer and the second electrode layer; the first insulating layer is located on a side of the second electrode layer away from the substrate, and the first insulating layer overlaps the touch electrode pattern and the wiring.

11. A display panel comprising:
a functional circuit region and a bonding region on a side of the functional circuit region;
wherein the bonding region comprises a substrate, a first conductive pattern on a first surface of the substrate, and a first insulating layer;
wherein the first conductive pattern comprises a first portion and a second portion; a distance between a top surface of the first portion and the first surface is larger than a distance between a top surface of the second portion and the first surface; the first insulating layer exposes the first portion and a boundary of the first insulating layer penetrates the second portion,
wherein the display panel further comprises: a second conductive pattern between the substrate and the first conductive pattern; an orthographic projection of the first portion on the substrate overlapping an orthographic projection of the second conductive pattern on the substrate.

12. The display panel according to claim 11, wherein a bottom portion of the first portion is electrically connected to a top portion of the second conductive pattern.

13. The display panel according to claim 11, wherein the second conductive pattern comprises a plurality of conductive layers stacked on each other.

14. The display panel according to claim 11, further comprising a second insulating layer between the first conductive pattern and the second conductive pattern.

15. The display panel according to claim 14, wherein the second insulating layer comprises a through hole, and the first conductive pattern is electrically connected to the second conductive pattern via the through hole.

16. A display panel comprising:
a functional circuit region and a bonding region on a side of the functional circuit region;
wherein the bonding region comprises a substrate, a first conductive pattern on a first surface of the substrate, and a first insulating layer;
wherein the first conductive pattern comprises a first portion and a second portion; a distance between a top surface of the first portion and the first surface is larger than a distance between a top surface of the second portion and the first surface; the first insulating layer exposes the first portion and a boundary of the first insulating layer penetrates the second portion,
wherein the display panel further comprises: a wiring extending from the functional circuit region to the bonding region; one end of the wiring being electrically connected to the second portion.

17. The display panel according to claim 16, wherein the functional circuit region comprises a touch electrode pattern; the touch electrode pattern and the first conductive pattern are located in a same layer; the other end of the wiring is electrically connected to the touch electrode pattern.

18. The display panel according to claim 17, wherein the touch electrode pattern comprises a first electrode layer and a second electrode layer, the second electrode layer is located on a side of the first electrode layer away from the substrate, and the first conductive pattern is disposed in a same layer as at least one of the first electrode layer and the second electrode layer.

19. The display panel according to claim 18, wherein the first insulating layer is located on a side of the second electrode layer away from the substrate, and the first insulating layer overlaps the touch electrode pattern and the wiring.

* * * * *